(12) United States Patent
Van Eijk

(10) Patent No.: US 8,441,616 B2
(45) Date of Patent: May 14, 2013

(54) LITHOGRAPHIC APPARATUS AND DEVICE MANUFACTURING METHOD

(75) Inventor: Jan Van Eijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 420 days.

(21) Appl. No.: 12/814,171

(22) Filed: Jun. 11, 2010

(65) Prior Publication Data

US 2011/0007294 A1    Jan. 13, 2011

Related U.S. Application Data

(60) Provisional application No. 61/223,970, filed on Jul. 8, 2009.

(51) Int. Cl.
G03B 27/58 (2006.01)
G03B 27/42 (2006.01)

(52) U.S. Cl.
USPC .............................. 355/72; 355/53

(58) Field of Classification Search ........... 355/53, 355/52, 72, 75
See application file for complete search history.

(56) References Cited

U.S. PATENT DOCUMENTS

| 5,446,519 A | 8/1995 | Makinouchi |
| 2007/0206167 A1* | 9/2007 | Mizutani ................. 355/52 |
| 2008/0240501 A1 | 10/2008 | Van Der Wijst et al. |
| 2009/0284724 A1* | 11/2009 | Kanaya .................. 355/53 |

FOREIGN PATENT DOCUMENTS

| JP | 08-078315 | 3/1996 |
| JP | 2000-182955 | 6/2000 |
| JP | 2007-318119 | 12/2007 |

OTHER PUBLICATIONS

Machine translation of 08-078315, Mar. 1996.*
Japanese Office Action mailed Feb. 24, 2012 in corresponding Japanese Patent Application No. 2010-150702.

* cited by examiner

*Primary Examiner* — Peter B Kim
(74) *Attorney, Agent, or Firm* — Pillsbury Winthrop Shaw Pittman LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate. The substrate table and/or the support may be provided with an accelerometer to measure an acceleration of the substrate table and/or the support and the apparatus is provided with a calculator in communication with the accelerometer to calculate an acceleration based position signal from the acceleration measured by the accelerometer.

10 Claims, 2 Drawing Sheets

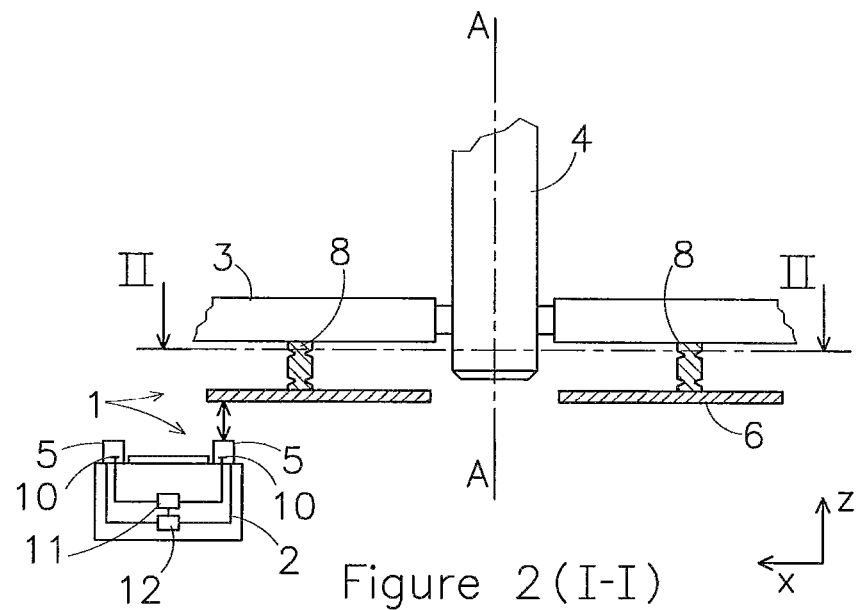
Figure 2 (I-I)
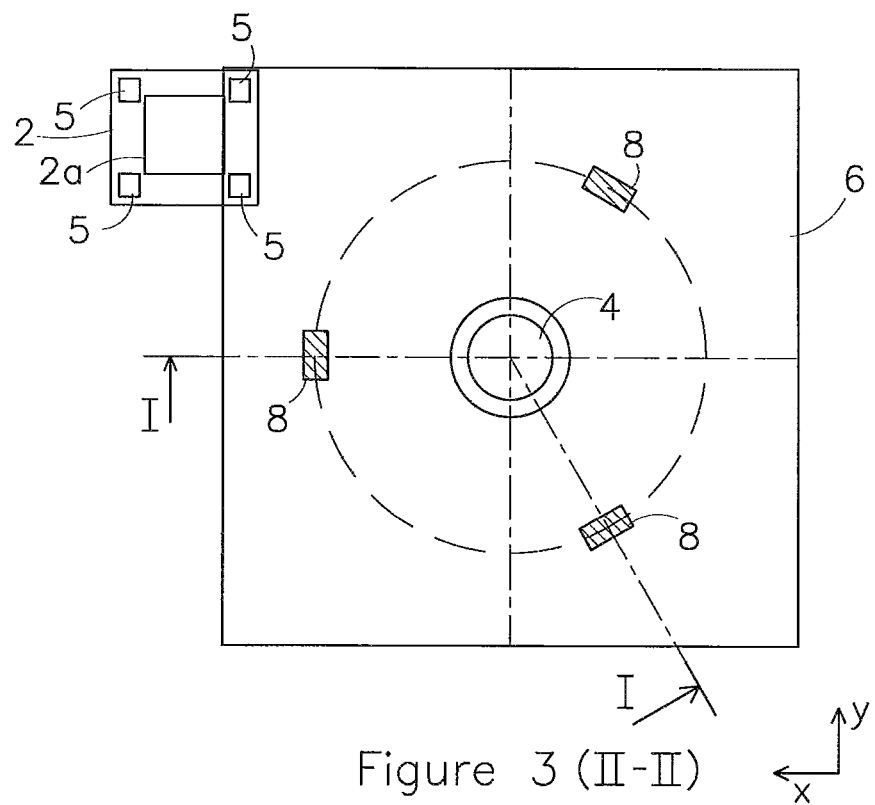
Figure 3 (II-II)

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application Ser. No. 61/223,970, entitled "Lithographic Apparatus and Device Manufacturing Method", filed on Jul. 8, 2009. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus it is desirable to position the substrate table and or the support with high precision.

SUMMARY

It is desirable to improve the precision of the positioning of the substrate table and/or the support.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and, a projection system configured to project the patterned radiation beam onto a target portion of the substrate, wherein the substrate table and/or the support is provided with an accelerometer to measure an acceleration of the respective substrate table and/or the support and the apparatus includes a calculator in communication with the accelerometer to calculate an acceleration based position signal from an acceleration measured by the accelerometer.

According to a further embodiment of the invention, there is provided a device manufacturing method including transferring a pattern from a patterning device onto a substrate; measuring an acceleration of the substrate and/or the patterning device and calculating an acceleration based position signal of the substrate and/or the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts schematically a side view of a measurement system according to an embodiment of the invention for measuring the position of a substrate stage in a lithographic apparatus; and, FIG. 3 depicts schematically a top view of the embodiment of FIG. 2.

DETAILED DESCRIPTION

Figure 1:
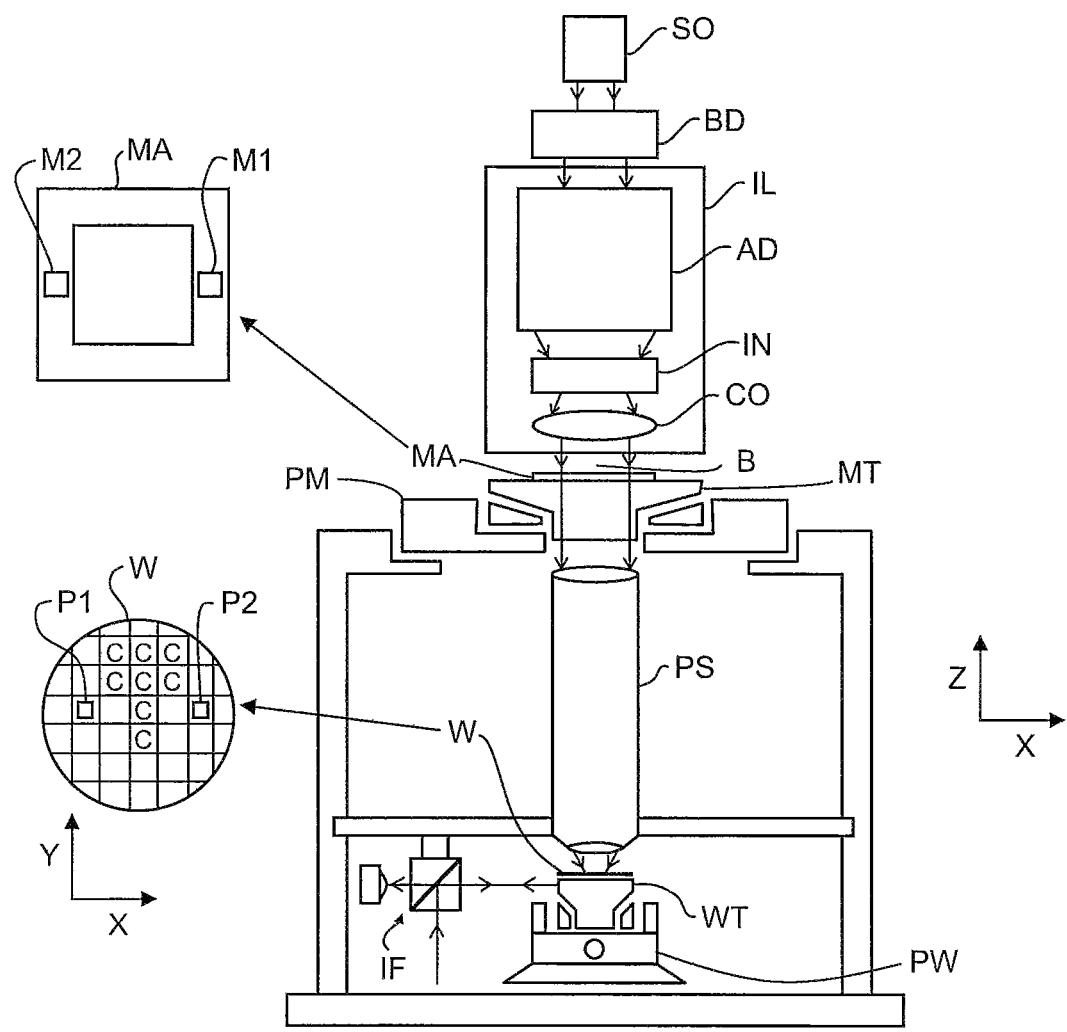
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more patterning device supports or mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device (e.g. mask) library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 2 and 3 show a side view and bottom view of a measurement system indicated with the reference numeral 1. The measurement system 1 is configured to measure the position of a substrate stage 2 supporting a substrate 2a with respect to a so-called metrology frame or metro-frame 3. The substrate 2a has a square shape in FIG. 3 however it may also be circular. The metro-frame 3 is a substantially stationary frame, to which the lens column 4 is mounted. In this respect it is remarked that a substantially stationary frame may be any frame which is passively or actively held in a substantially stationary position. The metro-frame 3 of the known lithographic apparatus is mounted with passive or active airmounts on a base frame to filter any external disturbances such as vibrations in the factory floor. In this way the lens column is held in a substantially stationary position. During a scanning movement of the substrate stage, it is desired to know the position of the substrate stage with respect to the lens column. Therefore, a position measurement system 1 is provided with which the position of the substrate stage with respect to the metro-frame 3 can be determined.

The measurement system 1 includes one or more sensors 5 which are used to determine the change in position of the substrate stage with respect to a sensor target object including a grating or grid, such as a sensor target plate. The sensors are capable of measuring the position of the substrate table in the X, Y and Z direction with respect to the sensor target object. The sensor target object is, in the embodiment shown in FIGS. 2 and 3, a grid plate 6 including a two-dimensional grid. The grid plate 6 includes a large number of grid lines or spots which are used for determining the position of the one or more sensors 5 with respect to the grid plate 6. The term grid plate as used in this application may refer to any type of sensor target object which is provided with a grid or grating as a part of a measurement system. Such measurement system is usually referred to as an encoder-type measurement system.

The grid plate 6 includes a central hole for the lens column 4 and is mounted on the metro-frame 3 with a mounting device including three flexure elements 8. The flexure elements 8 are arranged in a substantially horizontal plane. As depicted the grid plate 6 is mounted to a stationary frame while the incremental encoder 5 is mounted on the substrate table 2, however it is also possible to provide the grid plate 6 to the support and/or the substrate table 2 and the incremental encoder 5 to the stationary frame. The benefit being that the incremental encoder which may generate heat is not on the heat sensitive substrate table and or the support.

During movement of the substrate stage 2 in X and Y underneath the projection system 4 one of the measurement sensors 5 may move underneath the projection system 4 so that there is no part of the grid plate 6 opposite the one sensor. The one sensor will not be able to measure the position of the substrate table 2 for the time it is underneath the projection system 4. The measurement sensors 5 are connected to a control system 12 and if one of the sensors 5 will not be able to measure the position of the substrate stage 2 the control system 12 may still use the measurement information of the other measurement sensors 5. A disadvantage of switching between the measurement sensors 5 is that the controller 12 is adapted to five situations. A first situation where all four measurement sensors 5 are capable of providing a measurement signal to the controller 12 and four situations where one of the four measurement sensors is not capable to provide a measurement signal to the controller 12. This may require the controller 12 to be capable to handle five different situations with their different system dynamics. To avoid a situation wherein the controller 12 may be adapted to handle five different situations an accelerometer 10 may be provided to the substrate stage 2. The accelerometer may be connected to a calculator 11 configured to calculate an accelerometer based position signal for the measured acceleration. This can be done by integrating twice the accelerometer signal. The calculator may be connected to the controller 12 and if one of the position sensors 5 is not capable of providing a measurement signal to the controller 12 the accelerometer based position signal may be used from the calculator 11 of the accelerometer 10 positioned at the one position sensor. The calculator may be constructed and arranged to continuously calculate the accelerometer based position information of all four accelerometers 10 and provide it to the controller 12 and the controller 12 may be constructed to select the signal from the accelerometer 10 which is positioned at the measurement sensor which is not capable of measuring the position. Accelerometers 10 may not be capable of measuring at low frequencies but the changing dynamics that are influencing the position control stability of the controller 12 are only relevant at higher frequencies. The accelerometer based position signal as calculated by the calculator 11 may be selected by the controller 12 above a certain frequency. The certain frequency may be 100 Hz, preferably even 250 Hz.

In one embodiment, the lithographic apparatus includes a measurement sensor to measure the position of the substrate table and/or the support in a first direction over a first part of a range. In another embodiment, the apparatus includes a controller constructed and arranged to select the measurement signal of the measurement sensor over the first range and the acceleration based signal over a second part of the range. The measurement sensor may be an incremental encoder configured to measure a position of the sensor with respect to a scale extending over the first part of the range. The incremental encoder may be constructed and arranged to measure a position with respect to the Z-direction and at least one linear direction. In one embodiment, the measurement system includes four measurement sensors and at each time at least three of the four measurement sensors are measuring their position with respect a scale. The four measurement sensors may be provided with an accelerometer. The controller may be constructed and arranged, if a particular measurement sensor is not able to measure the position with respect to a scale, to select the accelerometer based position signal above a particular frequency and to select the measurement signal of one of the other measurement sensors than the particular measurement sensor if the accelerometer based position signal is below the particular frequency. The controller may be constructed and arranged to select the accelerometer based position signal from the accelerometer above a particular frequency. The particular frequency may be about 200 Hz.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate, wherein the substrate table and/or the support is provided with an accelerometer to measure an acceleration of the respective substrate table and/or the support and the apparatus includes a calculator in communication with the accelerometer to calculate an acceleration based position signal from the acceleration measured by the accelerometer, and
    a measurement sensor to measure the position of the substrate table and/or the support,
    wherein the acceleration based position signal is selected by a controller to determine the position of the substrate table and/or the support if the measurement sensor is unable to measure the position of the substrate table and/or the support.

2. The lithographic apparatus of claim 1, wherein the calculator is constructed and arranged to double integrate the acceleration to calculate the acceleration based position signal.

3. A lithographic apparatus, comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate, wherein the substrate table and/or the support is provided with an accelerometer to measure an acceleration of the respective substrate table and/or the support and the apparatus includes a calculator in communication with the accelerometer to calculate an acceleration based position signal from the acceleration measured by the accelerometer;
    a measurement system to measure the position of the substrate table and/or the support and provide a position measurement signal, the measurement system comprising a measurement sensor to measure the position of the substrate table and/or the support in a first direction over a first part of a range, and
    a controller constructed and arranged to select the measurement signal of the measurement sensor over the first range and the acceleration based position signal over a second part of the range.

4. The lithographic apparatus of claim 3, wherein the measurement sensor is an incremental encoder configured to measure a position of the sensor with respect to a scale extending over the first part of the range.

5. The lithographic apparatus of claim 4, wherein the incremental encoder is constructed and arranged to measure a position with respect to the Z-direction and at least one linear direction.

6. A lithographic apparatus, comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate, wherein the substrate table and/or the support is provided with an accelerometer to measure an acceleration of the respective substrate table and/or the support and the apparatus includes a calculator in communication with the accelerometer to calculate an acceleration based position signal from the acceleration measured by the accelerometer;
    a measurement system comprising four measurement sensors and at each time at least three of the four measurement sensors are configured to measure their position with resect a scale, and a controller that is constructed and arranged, if a particular measurement sensor is not able to measure the position with respect to a scale, to select the accelerometer based position signal above a particular frequency and to select the measurement signal of one of the other measurement sensors than the particular measurement sensor if the accelerometer based position signal is below the particular frequency.

7. The lithographic apparatus of claim 6, wherein the four measurement sensors are provided with an accelerometer.

8. The lithographic apparatus of claim 6, wherein the controller is constructed and arranged to select the accelerometer based position signal from the accelerometer above a particular frequency.

9. The lithographic apparatus of claim 6, wherein the particular frequency is about 200 Hz.

10. A device manufacturing method comprising:
transferring a pattern from a patterning device supported by a support onto a substrate supported by a substrate table;
measuring a position of the substrate table and/or the support with a measurement sensor;
measuring an acceleration of the substrate table and/or the support;
calculating an acceleration based position signal of the substrate table and/or the support, and
selecting the acceleration based position signal by a controller to determine the position of the substrate table and/or the support if the measurement sensor is unable to measure the position of the substrate table and/or the support.

* * * * *